United States Patent [19]

Okamoto et al.

[11] Patent Number: 4,959,329
[45] Date of Patent: Sep. 25, 1990

[54] SEMICONDUCTOR DEVICE

[75] Inventors: Tatsuo Okamoto; Akihiko Ohsaki, both of Itami, Japan

[73] Assignee: Mitsubishi Denki Kabushiki Kaisha, Tokyo, Japan

[21] Appl. No.: 425,926

[22] Filed: Oct. 24, 1989

Related U.S. Application Data

[62] Division of Ser. No. 174,498, Mar. 28, 1988, Pat. No. 4,887,143.

[51] Int. Cl.$^5$ .................... H01L 21/44; H01L 21/48
[52] U.S. Cl. ...................................... 437/187; 437/24; 437/26; 437/959
[58] Field of Search ................ 437/26, 187, 24, 39, 437/959, DIG. 23, DIG. 40

[56] References Cited

U.S. PATENT DOCUMENTS

| | | | |
|---|---|---|---|
| 4,164,461 | 8/1979 | Schilling | 204/192 |
| 4,412,868 | 11/1983 | Brown et al. | 437/24 |
| 4,523,213 | 6/1985 | Konaka et al. | 437/24 |
| 4,683,637 | 8/1987 | Varker et al. | 437/24 |
| 4,700,454 | 10/1987 | Baerg et al. | 437/24 |
| 4,706,378 | 11/1987 | Havemann | 437/24 |
| 4,717,677 | 1/1988 | McLaughlin et al. | 437/233 |
| 4,837,186 | 6/1989 | Ohata et al. | 437/24 |

FOREIGN PATENT DOCUMENTS

| | | | |
|---|---|---|---|
| 49-35029 | 9/1974 | Japan . | |
| 49-39233 | 10/1974 | Japan . | |
| 54-16716 | 6/1979 | Japan . | |
| 55-01141 | 1/1980 | Japan | 357/23.7 |
| 56-32742 | 4/1981 | Japan | 437/24 |

OTHER PUBLICATIONS

Electronics Letters, Aug. 31, 1978, vol. 14, No. 18, pp. 593–594, "C.M.O.S. Devices Fabricated on Buried SiO$_2$ Layers Formed by Oxygen Implantation into Silicon".

*Primary Examiner*—Brian E. Hearn
*Assistant Examiner*—Trung Dang
*Attorney, Agent, or Firm*—Oblon, Spivak, McClelland, Maier & Neustadt

[57] ABSTRACT

The present invention relates to a semiconductor device having a contact electrode structure and a method of manufacturing the same. An insulating layer is provided in a second semiconductor layer or in a junction part between the second semiconductor layer and a first semiconductor layer correspondence to a contact hole. Therefore, even if a pit generated at a junction part between the second semiconductor layer and a conductive layer in the contact hole grows, the growth of the pit is inhibited by the insulating layer, whereby leakage current caused between the first and second semiconductor layers can be reduced, a reliability of the device being thus enhanced.

3 Claims, 4 Drawing Sheets

SEMICONDUCTOR DEVICE

This is a division of application Ser. No. 174,498, filed on Mar. 28, 1988, now U.S. Pat. No. 4,887,143.

BACKGROUND OF THE INVENTION

2. Field of the Invention

The present invention relates to a semiconductor device and, more particularly, it relates to a contact electrode structure for such device.

2. Description of the Prior Art

FIG. 1 is a sectional view showing a contact electrode structure of a conventional semiconductor device. As shown in FIG. 1, a p-type layer 2 having a thickness of x is formed on an n-type silicon substrate 1 and an insulating layer 4 is formed on the p-type layer 2. The insulating layer 4 has a contact hole 5 formed in a specified portion thereof so that a surface of the p-type layer 2 is exposed. Further, an aluminum layer 3 of an aluminum alloy is provided on the insulating layer 4 so that the aluminum layer 3 is electrically connected through the contact hole 5 to the p-type layer 2. A potential being more than 5 volt is applied to the n-type silicon substrate 1 as a substrate potential. A potential of 0 to 5 volt is applied to the p-type layer 2 through the aluminum layer 3. Therefore, a reverse bias potential is applied to a p-n junction part between the n-type silicon substrate 1 and the p-type layer 2. Generally, when a power source potential is 5 V, voltage-proof in the junction betWeen the n-type silicon substrate 1 and the p-type layer 2 is required at least 10 V or so.

However, even if the junction part between the n-type silicon substrate 1 and the p-type layer 2 has sufficient voltage-proof, microscopically some leakage current may flow through the junction part. Especially with a dynamic random access memory (DRAM), it is important to reduce the leakage current in view of the performance characteristics required of the memory.

As a factor of increasing the leakage current, it can be pointed out that a pit is produced by a reaction between the p-type layer 2 and the aluminum layer 3. The cause of such pit being produced can be explained by the following fact. The semiconductor device shown in FIG. 1 is subjected to various kinds of heat treatment in a following process. In the stage of heat treatment, a maximum applicable temperature is about 450° C. The solid solubility of silicon in aluminium at this temperature is 0.48 wt %. Therefore, when the semiconductor device is subjected to heat treatment at 450° C., the silicon component of the p-type layer 2 is diffused to aforesaid solid solubility limit into the aluminum alloy which constitutes the aluminum layer 3. In order to prevent such reaction, it is a usual practice to alloy the aluminum layer 3 with silicon in a quantity of more than the solid solubility limit so that the silicon in the aluminum is supersaturated. However, even if such approach is taken, the distribution of a concentration of the silicon in the aluminum layer 3 is not uniform and, therefore, in the aluminum layer 3 there is present a portion in which the concentration of the silicon in the aluminum layer 3 is lower than the solid solubility limit. Thus, such portion in the aluminum layer 3 and the p-type layer 2 will react with each other in the above mentioned manner.

If the silicon component of the p-type layer 2 is diffused in the aluminum layer 3 in such way, a hole is formed in the p-type layer 2 as shown in FIG. 2, and some aluminum from the aluminum layer 3 enters the hole to form a pit 10. When the thickness x of the p-type layer 2 is sufficiently large as compared with the pit 10 so formed, there is no problem of increasing the leakage current.

Recently, however, as the semiconductor device is required higher integration, the thickness x of the p-type layer 2 is becoming smaller. When the thickness x of the p-type layer 2 is so small as to permit a pit 10 to bring into contact with the n-type silicon substrate 1 by growth through the p-type layer 2, the n-type silicon substrate 1 and the aluminum layer 3 are electrically connected to each other by the pit 10, which naturally leads to the problem of increasing the leakage current.

As an approach for solving such problem, it has been proposed to provide such a barrier metal layer as shown in FIG. 4. A device shown in FIG. 4 has three points of difference from the device shown in FIG. 1. First, a barrier metal layer 11 formed of such material as TiW, TiN, or W is provided on a portion of a p-type layer 2 which corresponds to the bottom of a contact hole 5 and on a insulating layer 4, Second, an aluminum layer 3 is formed on the barrier metal layer 11. Further, the p-type layer 2 and the aluminum layer 3 are electrically connected through the barrier metal layer 11 In other respects, the device shown in FIG. 4 is entirely same as the device shown in FIG. 1.

The barrier metal layer 11 effectively acts as a barrier between the p-type layer 2 and the aluminum layer 3 at temperature of up to the order of 400°-500° C., but no such effect can be expected of it at temperature of more 500° C., particularly 550° C. In practice, therefore, such proposed structure shown in FIG. 4 involves same problem as encountered with the earlier mentioned conventional structure.

As another approach, it has been proposed to provide a silicide layer as shown in FIG. 5. A device shown in FIG. 5 has three points of difference from the device shown in FIG. 1. First, a silicide layer 12 is formed on a portion of a p-type layer 2 which corresponds to the bottom of a contact hole 5. Second, an aluminum layer 3 is formed on the silicide layer 12 and an insulating layer 4. Further, the p-type layer 2 and the aluminum layer 3 are electrically connected through the silicide layer 12. In other respects, the device in FIG. 5 is entirely same as the device shown in FIG. 1.

In such a semiconductor device, when ion implantation for forming the silicide layer 12 or ion implantation in any later stage is performed, some of the metallic atoms which constitute the silicide layer 12 will be transferred to a vicinity of a junction part between an n-type silicon substrate 1 and the p-type layer 2. In one method for forming the silicide layer 12, a specified metal layer (not shown) is formed on the p-type layer 2 and subsequently the metallic atom constituting the metal layer is thermally diffused. In this method, during the stage of thermal diffusion, the metallic atoms are diffused to the vicinity of the junction part between the n-type silicon substrate 1 and the p-type layer 2. In another method, ion mixing is carried out after a metal layer is formed on the p-type layer 2, and then the silicide layer 12 is formed by heat treating. In such method, metallic atoms are knocked on by the ion energy applied to a surface of the metal layer during the stage of ion mixing, and thus not only are the metal ions diffused into a top portion of the p-type layer 2, but they are scattered to the vicinity of the junction part between the n-type silicon substrate 1 and the p-type layer 2. In some case, ion implantation is carried out in the manufacturing process after the silicide layer 12 is formed. During this stage of ion implantation, the metallic atoms in the silicide layer 12 are knocked on by the energy of the ions, so that they may be scattered to the vicinity of the junction part between the n-type silicon substrate 1 and the p-type layer 2.

If some of the metallic atoms constituting the silicide layer 12 are transferred to the vicinity of the junction in this way, those metallic atoms will become a recombination center Thus, the recombination center acts as a path for the leakage current to increase the leakage current in the junction.

When such a barrier metal layer 11 or such a silicide layer 12 is formed, stress is exerted to the p-type layer 2. The stress concentrates especially on a region corresponding to the contact hole 5. As a result, there will arise a problem that the junction part between the n-type silicon substrate 1 and the p-type layer 2, which corresponds to the contact hole 5, is deteriorated in its operating characteristics.

SUMMARY OF THE INVENTION

The present invention is intended to provide a semiconductor device having a contact electrode structure for minimizing a leakage current and a method of manufacturing thereof. The semiconductor device in accordance with the invention comprises a first semiconductor layer of first conductivity type second semiconductor layer of second conductivity type formed on the first semiconductor layer a first insulating layer formed on the second semiconductor layer and having a contact hole in a specified portion thereof a conductive layer formed on the first insulating layer and electrically connected to the second semiconductor layer through the contact hole; and a second insulating layer formed in a region of the second semiconductor layer corresponding to the contact hole.

The second insulating layer may be formed in a junction part between the first and second semiconductor layers corresponding to the contact hole.

A first method of manufacturing a semiconductor device comprises a first step of forming a second semiconductor layer of second conductivity type on a first semiconductor layer of first conductivity type; a second step of a first insulating layer on the second semiconductor layer: a third step of forming a mask having an opening at a specified position on the first insulating layer; a fourth step of utilizing the mask to implant oxygen ions or nitrogen ions through the first insulating layer into a region closed to a boundary of the first and second semiconductor layers, thereby forming a second insulating layer; a fifth step of utilizing the mask to remove by etching a portion of the first insulating layer which corresponds to the opening of the mask so that a surface of the second semiconductor layer is exposed, thereby forming a contact hole: and a sixth step of removing the mask, and thereafter forming a conductive layer on the first insulating layer so that the conductive layer is electrically connected to the second semiconductor layer through the contact hole.

A second method of manufacturing a semiconductor device comprises a first step of forming a second semiconductor layer of second conductivity type on a first semiconductor layer of first conductivity type; a second step of forming a first insulating layer on the second semiconductor layer; a third step of forming a mask having an opening at a specified position on the first insulating layer; a fourth step of utilizing the mask to remove by etching a portion of the first insulating layer which corresponds to the opening of the mask so that a surface of the second semiconductor layer is exposed, thereby forming a contact hole; a fifth step of utilizing the mask to implant oxygen ions or nitrogen ions through the contact hole into a region close to a boundary of the first and second semiconductor layers, thereby forming a second insulating layer; and a sixth step of removing the mask, and thereafter forming on a conductive layer the first insulating layer so that the conductive layer is electrically connected to said second semiconductor layer through the contact hole.

A third method of manufacturing a semiconductor device comprises a first step of forming a second semiconductor layer of second conductivity type on a first semiconductor layer of first conductivity type a second step of forming a first insulating layer on the second semiconductor layer; a third step of forming a mask having an opening at a specified position on the first insulating layer a fourth step of utilizing the mask to remove by etching a portion of the first insulating layer which corresponds to the opening of the mask so that a surface of the second semiconductor layer is exposed, thereby forming a contact hole; a fifth step of removing the mask, and thereafter implanting oxygen ions or nitrogen ions through the contact hole into a region closed to a boundary of the first and second semiconductor layers, thereby forming a second insulating layer; and sixth step of a conductive layer forming on the first insulation layer so that the conductive layer is electrically connected to the second semiconductor layer through the contact hole.

Therefore, a principal objective of the invention is to provide a semiconductor device and a method of manufacturing the same, which can reduce leakage current caused between first and second semiconductor layers to achieve high reliability.

According to the present invention, the growth of a pit produced by the reaction between the second semiconductor layer and the conductive layer is inhibited by the second insulating layer, whereby, leakage current caused by the pit can be minimized. Furthermore, scattering of metallic atoms produced in the stage of forming the silicide layer or the ion implantation after forming the silicide layer is effectively prevented by said second insulating layer, thus the generation of the leakage current caused by such metallic atoms can be prevented.

These and other objects, features, aspects, and advantages of the present invention will become more apparent from the following detailed description of the present invention when taken in conjunction with the accompanying drawings.

DESCRIPTION OF THE PREFERRED EMBODIMENTS

Figure 1:
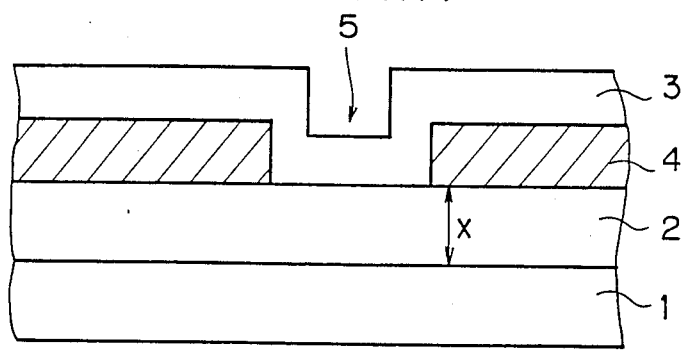
FIGS. 1 to 5 are sectional views showing conventional semiconductor devices.
Figure 2:
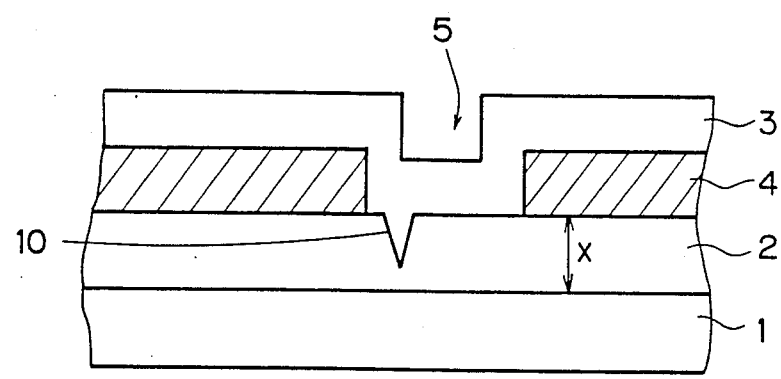
Figure 3:
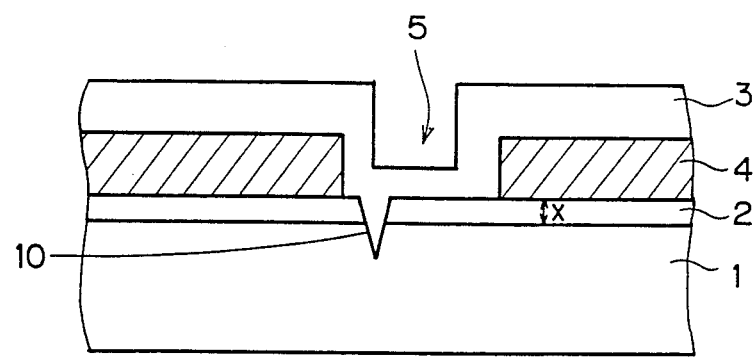
Figure 4:
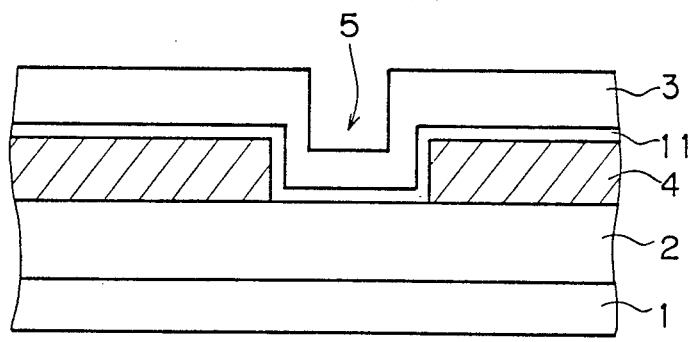
Figure 5:
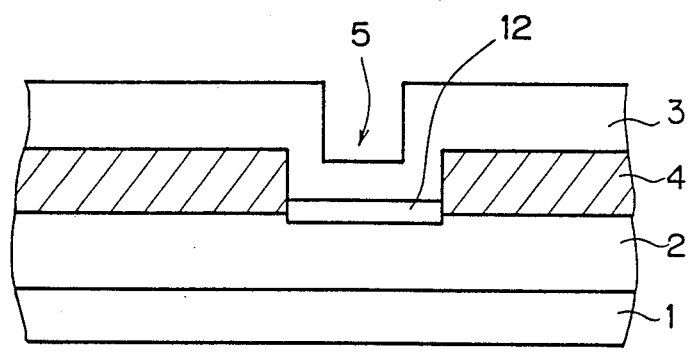
Figure 6:
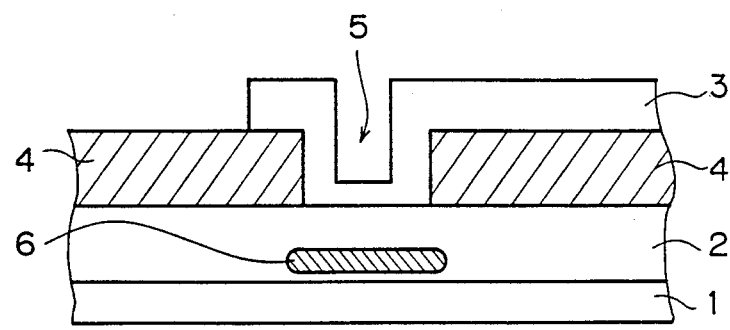
FIG. 6 is a sectional view showing an embodiment of the semiconductor device in accordance with the present invention

FIG. 6 is a sectional view showing an embodiment of a semiconductor device according to the present invention. A semiconductor device shown in FIG. 6 has a point of difference from the conventional semiconductor device shown in FIG. 1. The point of difference is that an insulating layer 6 is formed in a internal region of a p-type layer 2 corresponding to a contact hole 5. Other structure of the embodiment is identical to that of the conventional semiconductor device shown in FIG. 1.

Figure 7:
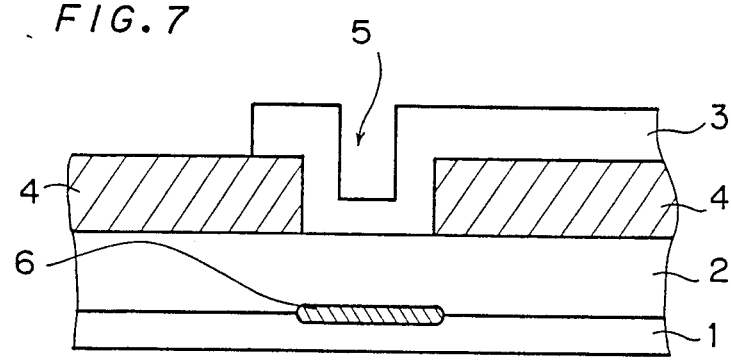
FIG. 7 is a sectional view showing another embodiment of a semiconductor device of the present invention.

FIG. 7 is a sectional view showing another embodiment of a semiconductor device according to the present invention. The semiconductor device shown in FIG. 7 has a point difference from the conventional semiconductor device shown in FIG. 1. The point of difference is that an insulating layer 6 is formed in a junction part between a p-type layer 2 and an n-type silicon substrate 1 corresponding to a contact hole 5. Other structure of the embodiment shown in FIG. 7 is identical to that of the conventional semiconductor device shown in FIG. 1.

Figure 8:
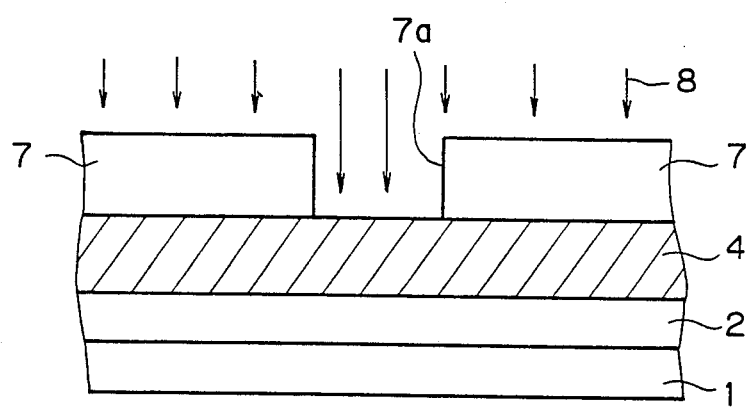
FIG. 8 is a sectional view illustrating a process for manufacturing a semiconductor device in accordance with the present invention.

A p-type layer 2 is first formed on an n-type silicon substrate 1. An insulating layer 4 is formed on the entire surface of the p-type layer 2. Thereafter as shown in FIG. 8 a photoresist is formed on the insulating layer 4, and thereafter the photoresist is patterned for formation of an opening 7a. Then, oxygen ions 8 are implanted into the p-type layer 2 through the insulating layer 4 by using the patterned photoresist 7 as a mask. In this case, the depth of ion implantation is determined by controlling the acceleration voltage, etc. applied for acceleration of the oxygen ions 8. If the depth of ion implantation is less than distance x from the surface of the p-type layer 2, an insulating layer 6 of $SiO_2$ is formed in an internal region of the p-type layer 2 corresponding to the contact hole 5, as shown in FIG. 6. If the depth of ion implantation is about equal to distance x from the surface of the p-type layer 2, an insulating layer 6 of $SiO_2$ is formed in a junction part between the n-type silicon substrate 1 and the p-type layer 2, as shown in FIG. 7. The insulating layer 6 thus formed is not complete in its required performance, and the p-type layer 2 has suffered from damages such as lattice defect and the like due to ion implantation. After the ion implantation, therefore, heat treatment is carried out, as required, in order to make up for such deficiencies. Thereafter, a portion of the insulating layer 4 which corresponds to aforesaid opening 7a is removed by etching to form a contact hole 5. Thereafter the photoresist 7 is removed, and then as an aluminum layer 3 is formed on the p-type layer 2 at the bottom of the contact hole 5 and on the insulating layer 4. Thus, a semiconductor device as shown in FIG. 6 or 7 is obtained.

Figure 9:
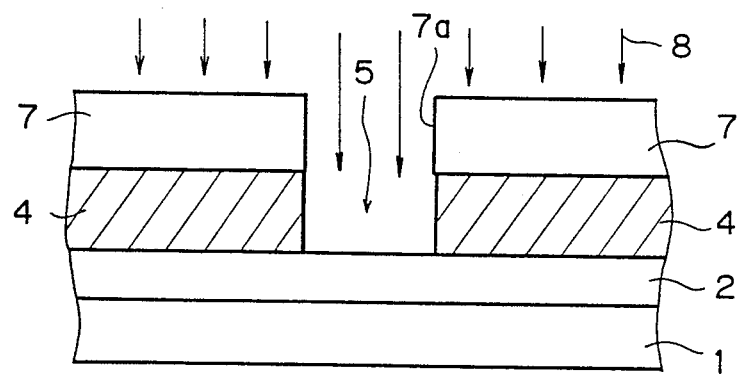
FIGS. 9 and 10 are sectional views illustrating other processes for manufacturing a semiconductor device according to the present invention respectively.
Figure 10:
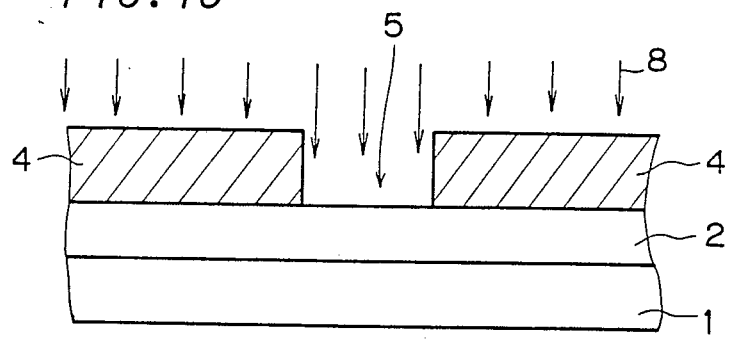

In the above described method, the insulating layer 6 is formed prior to the formation of the contact hole 5. Alternatively, as shown in FIG. 9, after a contact hole 5 is formed In the state of being left a photoresist 7 on the insulating layer 4, the insulating layer 6 may be formed in manner as above described. In another method, as shown in FIG. 10, after a contact hole is formed and a photoresist 7 is removed, an insulating layer 6 may be formed in the above described manner.

In the foregoing description, the insulating layer 6 is formed of $SiO_2$. Alternatively, nitrogen ions may be implanted instead of oxygen ions 8 so that the insulating layer 6 is formed of SiN.

Figure 11:
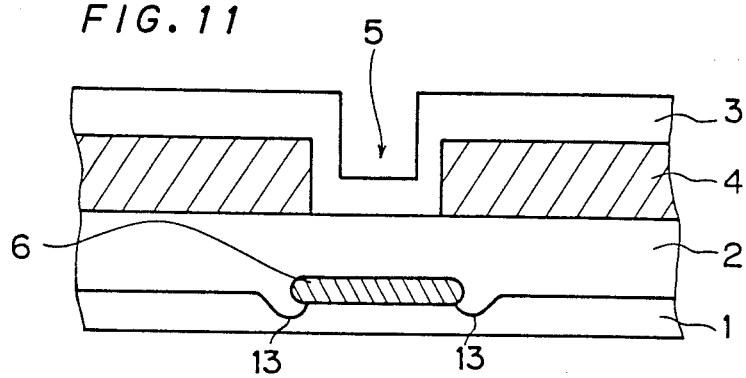
FIG 11 is a sectional view illustrating a modified form of the semiconductor device shown in FIG. 7.
Figure 12:
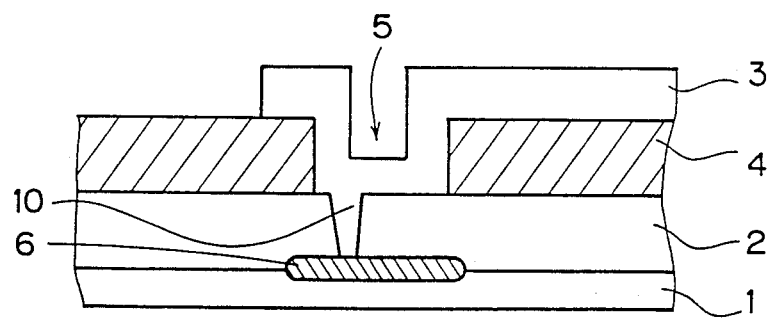
FIG. 12 is a view showing the principle of leakage current reduction according to the present invention.

It is noted that when the insulating layer 6 is formed in the junction between the n-type silicon substrate 1 and the p-type layer 2, the p-n junction characteristic in the p-n junction part adjoined the insulating layer 6 may become deteriorated. The reason is that some of the impurity content of the p-type layer 2 is diffused from the p-type layer 2 into the insulating layer so that the impurity concentration in that part of the p-type layer 2 which adjoins the insulating layer 6 becomes lower than that in the remaining part thereof. In such case, as shown in FIG. 11, before the insulating layer 6 is formed, impurities should be implanted and diffused in a region 13 corresponding to the location for formation of the insulating layer 6, In order to compensate for the impurity into the insulating layer 6 to the amount of diffused impurity As described above, the insulating layer 6 is formed in a region within the p-type layer 2 corresponding to the contact hole 5, or in a junction part between the n-type silicon substrate 1 and the p-type layer 2 corresponding to the contact hole 5, whereby even if a pit 10 is produced in the junction part between the p-type layer 2 and the aluminum layer 3 as shown in FIG. 12 growth of the pit 10 toward the n-type silicon substrate 1 can be prevented by the insulating layer 6.

In this case, the aluminum in the pit goes into reaction with the insulating layer 6 while the growth of the pit 10 being inhibited by the insulating layer 6, but this reaction poses no particular problem. For example, when the insulating layer 6 is of $SiO_2$, the aluminum may reduce $SiO_2$ in an amount of several tens Å, but In such case, the insulating layer 6 can effectively act as a barrier against growth of the pit 10, if the insulating layer 6 is formed to the order of several hundreds Å.

In the embodiment of FIGS. 6 and 7, a barrier metal layer may be provided In the junction part between the p-type layer 2 and the aluminum layer 3 which corresponds to the bottom of the contact hole 5. In this case, generation of a pit 10 is prevented by the barrier metal layer under low temperature conditions, while under high temperature conditions, growth of pit 10 is prevented by the insulating layer 6. The barrier metal layer may be formed over an area extending from the bottom of the contact hole 5 to the upper surface of the insulating layer 4.

In the embodiments shown in FIGS. 6 and 7, a silicide layer may be provided in the junction part between the p-type layer 2 and the aluminum layer 3 which corresponds to the bottom of the contact hole 5. In this case, metallic atoms produced the stage of forming the silicide layer ion implantation after forming the silicide layer are caught by the insulating layer 6, and accordingly there is no such atom present in the junction part between the n-type silicon substrate 1 and the p-type layer 2. Thus, the occurrence of any leakage current due to such metallic atoms is prevented. Needless to say, production of a pit 10 is prevented by the silicide layer.

It is noted that along with the formation of the barrier metal or the silicide layer, some stress is exerted on the junction part between the n-type silicon substrate 1 and the p-type layer 2, which stress is relaxed by the insulating layer 6. Therefore, there is little possibility of the functional characteristics of the junction part being deteriorated by such stress.

Although the present invention has been described and illustrated in detail, it is clearly understood that the same is by way of illustration and example only and is not to be taken by way of limitation the spirit and scope of the present invention being limited only by the terms of appended claims.

What is claimed is:

1. A method of manufacturing a semiconductor device, said method comprising:
   a first step of forming a second semiconductor layer of second conductivity type on a first semiconductor layer of first conductivity type;
   a second step of forming a first insulating layer on said second semiconductor layer;
   a third step of forming a mask having an opening at a specified position on said first insulating layer;
   a fourth step of utilizing said mask to implant oxygen ions or nitrogen ions through said first insulating layer into a region closed to a boundary of said first and second semiconductor layers, thereby forming a second insulating layer;
   a fifth step of utilizing said mask to remove by etching a portion of said first insulating layer which corresponds to said opening of said mask so that a surface of said second semiconductor layer is exposed, thereby forming a contact hole; and
   a six step of removing said mask, then and thereafter forming a conductive layer on said first insulating layer so that the conductive layer is electrically connected to said second semiconductor layer through said contact hole.

2. A method of manufacturing a semiconductor device, said method comprising:
   a first step of forming a second semiconductor layer of second conductivity type on a first semiconductor layer of first conductivity type;
   a second step of forming a first insulating layer on said second semiconductor layer;
   a third step of forming a mask having an opening at a specified position on said first insulating layer;
   a fourth step of utilizing said mask to remove by etching a portion of said first insulating layer which corresponds to said opening of said mask so that a surface of said second semiconductor layer is exposed, thereby forming a contact hole;
   a fifth step of utilizing said mask to implant oxygen ions or nitrogen ions through said contact hole into a region close to a boundary of said first and second semiconductor layers, thereby forming a second insulating layer; and
   a sixth step of removing said mask and thereafter forming a conductive layer on said first insulating layer so that the conductive layer is electrically connected to said second semiconductor layer through said contact hole.

3. A method of manufacturing a semiconductor device, so said method comprising:
   a first step of forming a second semiconductor layer of second conductivity type on a first semiconductor layer of first conductivity type;
   a second step of forming a first insulating layer on said second semiconductor layer;
   a third step of forming a mask having an opening at a specified position on said first insulating layer;
   a fourth step of utilizing said mask to remove by etching a portion of said first insulating layer which corresponds to said opening of said mask so that a surface of said second semiconductor layer is exposed, thereby forming a contact hole;
   a fifth step of removing said mask and thereafter implanting oxygen ions or nitrogen ions through said contact hole into a region close to a boundary of said first and second semiconductor layers, thereby forming a second insulating layer; and
   a sixth step of forming a conductive layer on said first insulating layer so that the conductive layer is electrically connected to said second semiconductor layer through said contact hole.

* * * * *